(12) United States Patent
Rumsby

(10) Patent No.: US 8,710,403 B2
(45) Date of Patent: Apr. 29, 2014

(54) LASER PROCESSING A MULTI-DEVICE PANEL

(75) Inventor: Philip Thomas Rumsby, Bladon (GB)

(73) Assignee: M-SOLV Ltd., Oxford (GB)

(*) Notice: Subject to any disclaimer, the term of this patent is extended or adjusted under 35 U.S.C. 154(b) by 592 days.

(21) Appl. No.: 12/918,187

(22) PCT Filed: Feb. 18, 2009

(86) PCT No.: PCT/GB2009/000436
§ 371 (c)(1),
(2), (4) Date: Sep. 17, 2010

(87) PCT Pub. No.: WO2009/103964
PCT Pub. Date: Aug. 27, 2009

(65) Prior Publication Data
US 2011/0017716 A1    Jan. 27, 2011

(30) Foreign Application Priority Data
Feb. 19, 2008 (GB) .................................. 0802944.9

(51) Int. Cl.
*B23K 26/03* (2006.01)
*B23K 26/04* (2014.01)
*B23K 26/067* (2006.01)

(52) U.S. Cl.
USPC .................... 219/121.76; 219/121.83

(58) Field of Classification Search
USPC ............ 219/121.68, 121.69, 121.67, 121.72, 219/121.73, 121.75, 121.83, 121.7, 121.71, 219/121.76
See application file for complete search history.

(56) References Cited

U.S. PATENT DOCUMENTS 5,063,280 A * 11/1991 Inagawa et al. ............ 219/121.7
6,396,561 B1   5/2002 Vernacki et al. ................ 355/26
(Continued)

FOREIGN PATENT DOCUMENTS

EP    531558 A  *  3/1993
JP    61-86087 A  *  6/1987
(Continued)

OTHER PUBLICATIONS

Machine translation of Japan Patent document No. 10-314,972, Nov. 2012.*

(Continued)

*Primary Examiner* — Geoffrey S Evans
(74) *Attorney, Agent, or Firm* — KED & Associates LLP

(57) ABSTRACT

A system for processing a multi-device panel, comprising a substrate having front and rear surfaces, a first array of device regions located on the front surface and a second array of device regions on the rear surface, by vector direct-write laser ablation, comprising a first processing station comprising a pair of opposedly-mounted processing heads, each processing head comprising a laser beam delivery apparatus comprising a laser beam scanner and a lens unit, and a distance measurement device, mounting device for mounting the panel between the processing heads of the first processing station such that the relative position of the panel and the first processing station can be adjusted so that the processing heads are brought into alignment with selected front-surface and rear-surface device regions to be processed, wherein each processing head is operable to make an estimate of the distance between the lens unit and the surface of the device region to be processed using the distance measurement device, control the focus the lens unit dependent on said estimate and vector direct-write the device region.

12 Claims, 6 Drawing Sheets

(56) References Cited

U.S. PATENT DOCUMENTS

| | | | |
|---|---|---|---|
| 6,422,082 B1* | 7/2002 | Suh | 73/624 |
| 6,433,303 B1* | 8/2002 | Liu et al. | 219/121.7 |
| 6,720,567 B2* | 4/2004 | Fordahl et al. | 219/121.83 |
| 6,787,734 B2* | 9/2004 | Liu | 219/121.7 |
| 6,864,460 B2* | 3/2005 | Cummings et al. | 219/121.71 |
| 2002/0033387 A1* | 3/2002 | Kurosawa et al. | 219/121.71 |
| 2002/0166978 A1* | 11/2002 | Momose et al. | 250/491.1 |
| 2002/0198622 A1* | 12/2002 | Dinauer et al. | 700/166 |
| 2003/0178395 A1 | 9/2003 | Duignan | 219/121.68 |
| 2004/0118824 A1* | 6/2004 | Burgess | 219/121.71 |
| 2005/0184036 A1* | 8/2005 | Hunter et al. | 219/121.83 |
| 2007/0138154 A1* | 6/2007 | Seong et al. | 219/121.71 |
| 2007/0158315 A1* | 7/2007 | Tanaka et al. | 219/121.8 |
| 2008/0032066 A1 | 2/2008 | Stiblert et al. | 427/595 |
| 2008/0198434 A1* | 8/2008 | Matsushita et al. | 359/201 |

FOREIGN PATENT DOCUMENTS

| | | | |
|---|---|---|---|
| JP | 02-304515 A | | 12/1990 |
| JP | 10-314972 A | * | 12/1998 |
| JP | 2003-225787 A | * | 8/2003 |
| JP | 2004-35315 A | * | 2/2004 |
| JP | 2004-243383 A | * | 9/2004 |
| WO | WO 00/39625 A2 | | 7/2000 |
| WO | WO-2006/011671 A | * | 2/2006 |

OTHER PUBLICATIONS

PCT International Search Report dated May 25, 2009 issued in Application No. PCT/GB2009/000436.

\* cited by examiner

LASER PROCESSING A MULTI-DEVICE PANEL

The present invention relates to processing a multi-device panel by vector direct-write laser ablation.

Lasers have been used for many years for the direct processing of devices mounted on thin substrates such as printed circuit boards, flat panel displays or medical sensors. In most cases the requirement is to process only one side of the substrate at any time so that during processing it can be fully supported on a flat chuck which has the function of maintaining the substrate upper surface accurately at the image or focal plane of the lens system. However, in some cases, there is a requirement to simultaneously laser process opposite sides of thin substrates with the same or different patterns in order to speed production rates and simplify registration between the opposing patterns.

U.S. Pat. No. 5,923,403 discloses an apparatus for 2 sided, simultaneous, large area, scan and repeat, 1× mask projection imaging for the laser exposure of resist on opposite sides of glass sheet or PCB substrates.

U.S. Pat. No. 6,759,625 discloses an apparatus that uses 2 opposing laser beam scanner units to simultaneously direct write on opposite sides of a PCB mounted on stages between the 2 scanner units.

Both of the above-mentioned patent specifications assume the substrate panels are flat. No consideration is given to the situation that frequently occurs where thin panels vary in thickness and sag significantly as they are supported around the edges so as to permit 2-sided processing.

U.S. Pat. No. 6,396,561 discloses an apparatus that uses 2 opposing laser beam scanner units to simultaneously raster direct-write on opposite sides of a PCB and includes a mutual positioning mechanism to ensure that the images written on each side are positionally accurate with respect to each other. This document addresses the possible non-flatness of the substrate panel, see column 8, lines 36-44 and suggests that the panel be processed in a vertical plane to keep the panel flat or if processed in a horizontal plane suitably supported to keep the panel flat.

The present invention is concerned with the task of efficiently processing multi-device panels which may vary in thickness, be bent or prone to sagging. The present invention has particular application to situations in which the simultaneous, 2-sided processing of the panels is required.

The present invention is defined in the appended claims, and, according to a first aspect, may provide:

a system for processing a multi-device panel, comprising a substrate having front and rear surfaces, a first array of device regions located on the front surface and a second array of device regions on the rear surface, by vector direct-write laser ablation, comprising:

a first processing station comprising a pair of oppositely-mounted processing heads, each processing head comprising a laser beam delivery apparatus comprising a laser beam scanner and a lens unit, and a distance measurement means;

mounting means for mounting the panel between the processing heads of the first processing station such that the relative position of the panel and the first processing station can be adjusted so that the processing heads are brought into alignment with selected front-surface and rear-surface device regions to be processed;

wherein each processing head is operable to make an estimate of the distance between the lens unit and the surface of the device region to be processed using the distance measurement means;

control the focus the lens unit dependent on said estimate; and vector direct-write the device region.

The system according to the present invention is able to efficiently process a multi-device panel through the provision of a processing station comprising a pair of oppositely-mounted processing heads and by providing each processing head with its own independent laser focussing functionality. The processing station enables both surfaces of a device to be processed simultaneously which has a beneficial impact on the processing time per panel, while providing each processing head with its own independent laser focussing functionality enables the system to cope with non-flat panels.

Preferably, the system is arranged to operate in step and scan mode in which the first processing station and the panel are moved relatively in a stepwise manner, whereby successive front-surface and rear-surface device regions may then be processed by the laser beam scanner of the respective processing head. Step and scan mode is continued until all the device regions have been processed.

In one embodiment, the panel is close to midway between the two scanner and lens units and the panel surface is arranged to be close to normal to a line joining the centre of the lenses on the opposing scanner units.

In preferred embodiments, the processing capacity of the system can be boosted by including additional processing stations operating in parallel.

In the case of a system comprising an even number of processing heads is used to process a single panel, they are arranged to be in a line with the pitch between the respective lens units corresponding to the pitch or multiples of the pitch between devices in the direction on the panel parallel to the line of scanner and lens units. Alternatively, they can be arranged on a rectangular grid with the pitch between lens units in one direction corresponding to the pitch or multiples of the pitch between devices on the panel in that direction and the pitch between units in the other direction corresponding to the pitch or multiples of the pitch between devices on the panel in that other direction. For the case of a system comprising an odd number of processing heads used to process a single panel they are usually arranged to be in a line with the pitch between units corresponding to the pitch or multiples of the pitch between devices in the direction on the panel parallel to the line of scanner and lens units.

The system may comprise one or more laser units that emit beams that pass via various steering mirrors and beam splitter units to all the scanner units on one side of the panel. One or more different laser units emit beams that are directed to all of the scanner units on the opposite side of the panel. The number of laser units used to feed all the scanners on one side of the panel can be any number that is a devisor of the number of pairs of scanner lens units operating on the panel. The number of laser units used to feed all the scanners on the other side of the panel can be the same number or any other number that is a devisor of the number of pairs.

The lens unit comprises a focussing lens, usually of the so called f-theta type, is attached to each scanner unit in order to focus the beam onto or close to the surface of the panel. The mirrors in each scanner unit can be controlled such that the beam after the lens attached to each scanner unit can be made to focus over a certain square or rectangular area. The scan area corresponding to each scanner and lens unit is large enough such that the full area of each device region of each individual electronic device on the panel can be covered.

The system may comprise a pair of linear stage units in order to allow relative motion in two axes between the panel and the scanner and lens units such that all the devices on the panel can be processed.

The system may comprise a control unit that is able to control the motion of the XY stages as well as all the scanner units and lasers such that the panel is processed in a step and scan mode of operation. The control unit directs the movement of the panel with respect to the processing heads such that individual devices on the panel are located in alignment with a corresponding processing head. The stages are, preferably, locked to prevent further panel motion and the scanners and lasers operated to process opposite sides of the devices situated between corresponding scanner and lens units. After processing of both sides of each device is complete the stages move the panel with respect to the pairs of scanner and lens units such that a new device is positioned between each scanner and lens pair and the laser process is repeated. This step and scan sequence is repeated until all the devices on the panel have been processed.

In a preferred embodiment, the optical measurement comprises a camera unit. For optimum performance this camera unit is mounted on the side of the scanner and lens unit such that it has an optical axis that is perpendicular to the panel surface and a field of view that is within the process scan field or alternatively as close as possible to the edge of the process scan field. The magnification of the camera unit is chosen such that it is low enough so the camera field of view is wide enough to observe the same alignment feature on each device as the panel is stepped on the nominal device pitch and yet is high enough to observe the alignment features with sufficient accuracy to meet the pattern to device alignment requirements.

It is possible to use other types of camera system that view the alignment marks on devices on the panel through the f-theta lens on each scanner unit. Such systems have the advantage that they can view the device directly below the lens but a major disadvantage is that they view via the scanner mirrors and the scan lens which are optimized for operation at the laser wavelength and hence they are optically inferior to a white light, direct view off axis system. In addition as they view via the two mirrors in the scanner they can suffer positional errors.

Where precision alignment between the process pattern to be written and an existing pattern or alignment marks on each device is required, the camera unit may be used for alignment in the following way. The panel is moved with respect to the pairs of scanner and lens units such that alignment marks on opposite sides of devices are positioned in the field of view of each camera unit. The offset distances of the images of the alignment marks from a reference position are noted for each camera. The panel is then moved by a known amount in X and Y so that another alignment feature on each device is in the camera field of view and the offsets recorded. The panel is then moved so that the scanner is centrally placed over the device and the offset information used by the scanner control system to correct the direct write pattern size and lateral and angular positions to match the device accurately. This process is repeated each time the panel is stepped to process a new device.

Preferably, the control unit is able to drive all scanner units simultaneously so that devices on the front and back of the substrate are processed at the same time. The control unit is sufficiently flexible that the direct-write patterns which are applied to devices can be different for all the scanners of the system. In practice, it is envisaged that often the patterns applied to one side of the devices on a panel will all be the same and those applied to the opposite side of the devices will also be the same but different to those on the first side. Nevertheless, the apparatus is capable of applying different patterns to both sides of every device on the panel if required.

Preferably, a said lens unit comprises an optical beam expander or a telescope unit. The telescope unit is arranged such that one component of the telescope is mounted on a servo-motor driven stage so that the separation between the two optical components can be reduced or increased in order to control the distance from the focussing lens to the beam focus for each individual scanner and lens unit. Such devices are well known and are frequently used with scanners and f-theta lenses to correct for curvature of the focal plane of the lens and adjust the beam focus plane so that it coincides with the flat surface of a substrate. Increasing the separation between the components beyond the nominal separation in a simple 2 component beam expansion telescope causes the beam exiting the telescope to become un-collimated and to converge. This causes the focus point beyond the following lens to move closer to the lens. Decreasing the separation between the components beyond the nominal separation causes the beam exiting the telescope to diverge. This causes the focus point beyond the following lens to move away from the lens.

Preferred optical measurement means comprises types of sensor for measuring the distance between the panel surface and the lens are based on optical triangulation methods. In one embodiment, a laser diode or other directed light source is attached to the scanner and lens unit and the beam is directed at an angle towards the panel and focussed to create a small spot on the surface. The radiation scattered or reflected from the spot on the surface is collected by a camera unit, consisting of a lens and optical detector, which is also mounted on the scanner and lens unit. The lens is arranged such that it forms an image of the spot on the detector. 2D detectors such as CCD cameras or 1D detectors such as linear diode arrays or position sensitive detectors are suitable optical detectors. If the distance of the panel surface from the scanner and lens unit changes, the position of the spot on the panel moves laterally and consequently the image of the spot moves on the detector. The electronic output from the detector is processed to generate a signal that is passed to the servo motor system controlling the position of the moving component in the beam expansion telescope. The laser beam directed towards the panel surface has to be at some angle to the normal to the panel surface in order to achieve lateral movement of the spot across the surface as the distance from the scanner and lens unit to the panel changes. For a given change of distance from the scanner and lens unit to the panel, the larger the angle between the beam and the normal to the panel, the greater is the movement of the spot across the surface and the greater the distance measurement accuracy. In practice angles of between 30 degrees and 60 degrees to the normal are generally used but larger angles are also possible.

The spot imaging camera unit can be disposed in either of two ways. In one way the lens and detector unit is mounted at an angle to the normal to the panel. This arrangement is convenient as it allows distance measurements to be made on the surface of the panel at a point close to the centre of the scan field of the scanner and lens unit. In another arrangement the camera unit is mounted such that its optical axis is normal to the panel surface. In this case, distance measurements are made at some point that is away from the centre of the scan field but the arrangement has the advantage that the lens and detector unit can serve the common functions of device alignment and distance sensing.

For panels that are not flat and vary in thickness and where alignment to each individual device is required it is envisaged that processing proceeds as follows. The panel is moved with respect to the pairs of scanner and lens units such that alignment marks on opposite sides of devices are sequentially positioned in the field of view of the alignment camera units. The offset distances of the images of the alignment marks from reference positions are noted for each camera at each alignment location. The panel is then moved so that the distance sensor detection area is positioned at a suitable location on the device and the distance between the unit and panel surface measured. The panel is then moved so that the scanner and lens unit is centralized on the device and the information generated by the various camera and sensor units used by the control system to correct the pattern size and lateral and angular position and to adjust the beam telescope to set the focus at the correct distance with respect to the panel surface. This process is repeated each time the panel is stepped to process a new device.

For situations where the flatness or thickness of the panel varies significantly over each device it may be appropriate to make more than a single measurement of distance between the scanner and lens unit and panel surface. In this case multiple measurements of distance over a matrix of points are made and the data used during device processing to move the telescope component so that the beam focus accurately follows the device surface profile.

Other types of distance measurement means can also be used. Non surface contacting sensors based on capacitive or inductive processes are possible as well are those using ultrasonics and pneumatics. Systems using con-focal optical methods also have merit in some cases. If the surface of the panel is robust and inflexible contacting mechanical probes can also be used.

There are many different ways that the required relative motion between panel and the pairs of scanner and lens units can be achieved. The units can be held stationary and the panel caused to move in 1 or 2 axes. Alternatively the panel can remain stationary during processing with the scanners and lens units moving 2 axes on a carriage that can move on a gantry over the panel in one direction with the gantry itself able to move over the panel in an orthogonal direction. Thirdly, the panel can move in one axis and the scanner and lens units move in the orthogonal axis on a gantry over the panel. This last case is convenient as the footprint of the system is generally minimized with this arrangement.

The preferred embodiments of the invention show the panel being processed while horizontal; this need not be the case. Alternatively, the panel may be held vertically or even at some angle to the vertical. In the context of the present invention, references to the front and rear of the substrate have been used for clarity when differentiating between the sides. No priority or orientation is intended to be implied.

Exemplary embodiments of the invention will now be described with reference to the accompanying drawings, in which.

Figure 1:
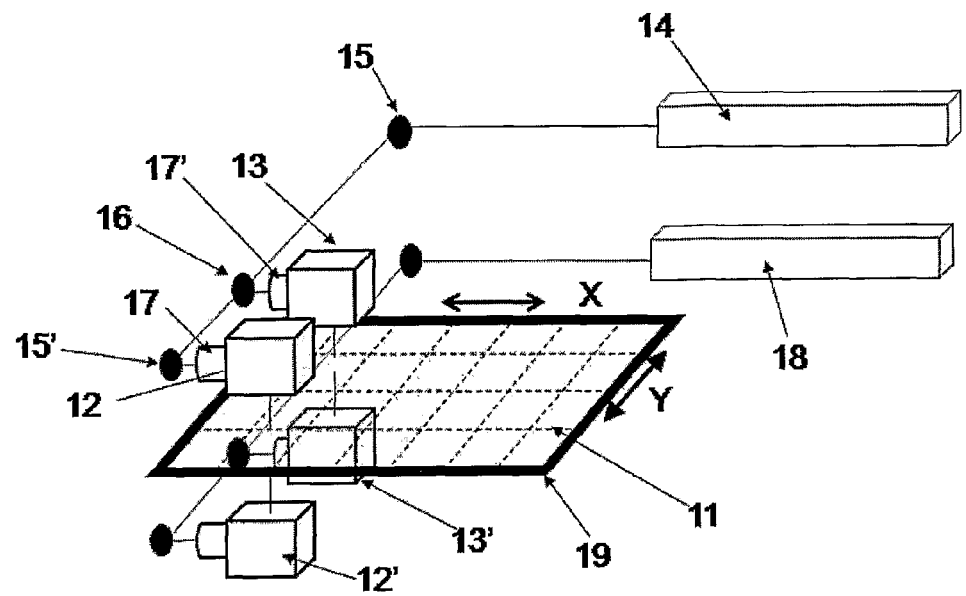
FIG. 1 shows a general arrangement of the system.

FIG. 1 shows the key elements of the system. A thin panel type substrate 11 is mounted between two pairs of opposing 2 axis scanner and lens units 12, 12' and 13, 13'. A laser 14 generates a beam that passes via mirrors 15, 15', a 50% beam splitter 16 and variable telescopic beam expansion units 17, 17' to enter the upper 2 scanner units. A separate laser 18 feeds the lower two scanner and lens assemblies via a similar arrangement of optics. So that the lower laser beams can access the underside of the panel it is mounted on an open frame type support 19 on CNC stages that cause it to move in 2 orthogonal directions X and Y between the scanner and lens units. The panel is sub-divided into a rectangular array of device areas with an even number of devices in the Y direction and the pitch of the scanner and lens units in the Y direction (P) is set to a value given by:—

$$P = p \times N/n,$$

where p is the pitch of the devices on the panel in the Y direction, N is the total number of devices in the Y direction and n is the number of scanner and lens units in the Y direction. The system operates in step and scan mode with the panel stepping in Y to complete all devices in a Y row followed by steps in X to allow new Y rows to be processed. The drawing shows the case where only two pairs of scanner and lens units are used to process the panel but in practice a greater number of pairs of units can be used if required to increase production rate.

Figure 2:
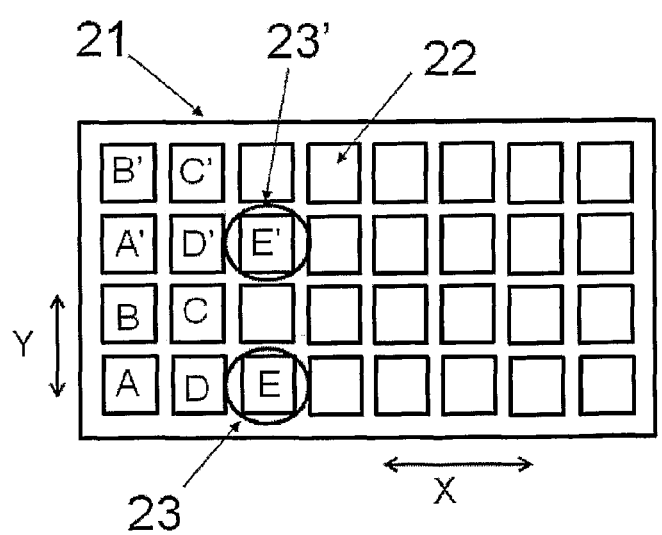
FIG. 2 shows a panel divided into an array of device areas corresponding to separate electronic devices.

FIG. 2 shows an example of a panel 21 that is subdivided into a 4×8 array of 32 device areas 22 corresponding to separate devices. Two pairs of scanner and lens units 23, 23' are set at a distance apart equal to twice the device pitch in the Y direction and operate on both sides of two separate devices at the same time. The step and scan process sequence is such that devices A and A' are processed together followed by B and B'. The panel then moves one device pitch in the X direction and devices C and C' are processed followed by D and D'. The drawing shows the next step where devices E and E' are being processed. This step and scan process continues until all devices on the panel have been processed. The drawing shows the case where the panel is sub-divided into 32 device areas but in practice larger or smaller numbers of devices are possible.

Figure 3:
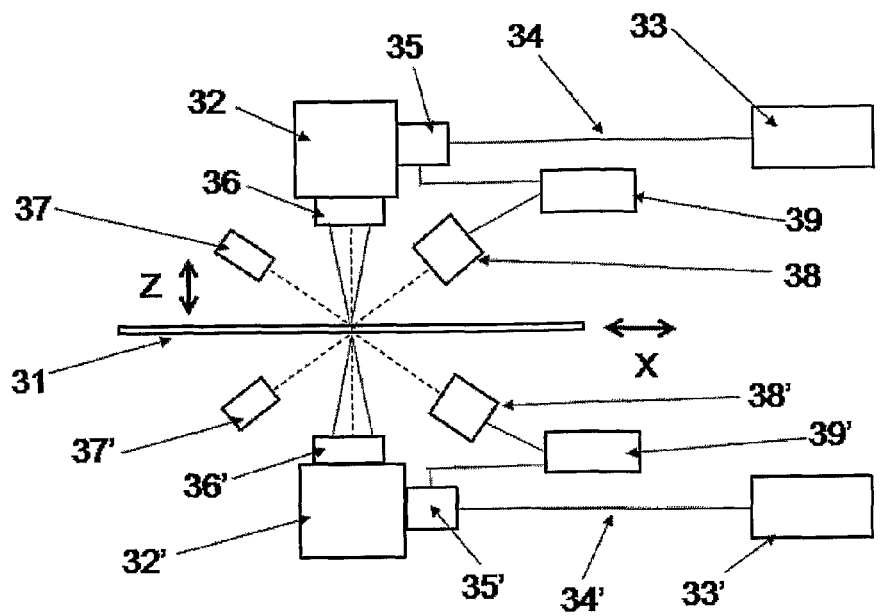
FIG. 3 shows a detailed view of one pair of the multiple scanner units.

FIG. 3 shows the basic arrangement of one pair of scanner and lens units. A panel 31 is mounted between 2 opposing scanner and lens units 32, 32' such that a line joining the centre of the units is normal or close to normal to the panel surface. The panel is supported on an open frame to give laser access to both sides of the panel and is able to move in an XY plane perpendicular to the line joining the scanner and lens units. Laser units 33, 33' which may have similar or different output characteristics, emit pulsed laser beams 34, 34' which pass via various mirrors and splitters to beam expansion telescope units 35, 35' attached to the scanner and lens units. F-theta lenses 36, 36' focus the beams onto or close to the panel surface. Adjustment of the telescope unit allows the beam focal points to be moved in the Z direction closer to or further away from the panel surface. Laser diode units 37, 37' are attached to their respective scanner and lens units and direct laser beams onto the panel surfaces to form spots close to the centre of the field of view of each scanner and lens unit. Camera units 38, 38' with associated imaging optics are attached to their respective scanner and lens units and receive the laser radiation scattered or reflected from the spots and record their position on the panel surface. The output signals from the camera units are processed by electronic units 39, 39' which then drive the servo-motor systems that control the separation between the optical components in the telescopes.

Figure 4:
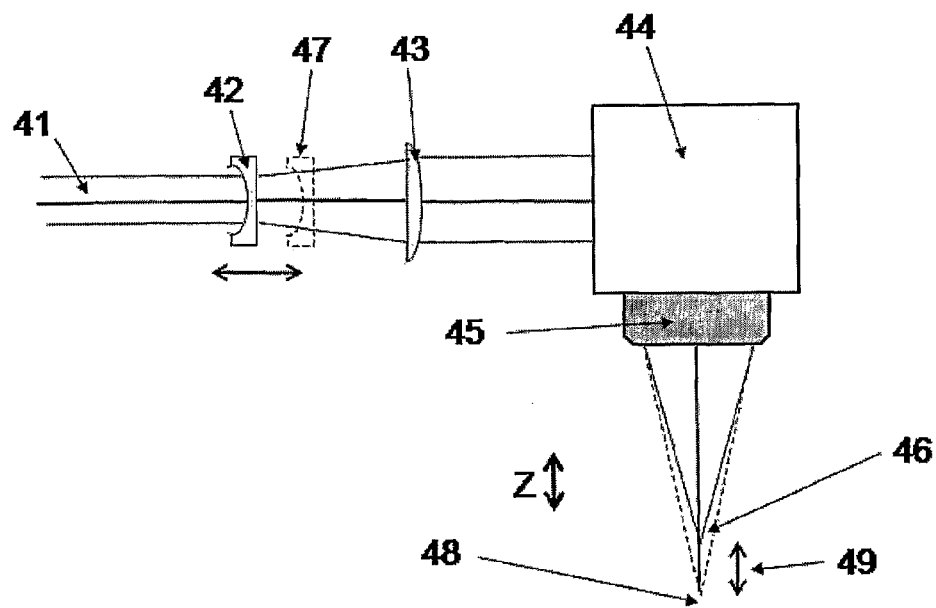
FIG. 4 shows an optical telescope arrangement for controlling the position of the beam focus.

FIG. 4 shows the method of operation of one variable beam telescope unit. A laser beam 41 passes through lens 42, that has negative focal length, followed by lens 43, that has positive focal length and then passes to the scanner unit 44. F-theta lens 45 focuses the beam to a position 46. Movement of the negative lens to position 47 so that the separation between the two telescope lenses decreases causes the beam exiting the telescope to diverge and the focus of the beam after the f-theta lens to move in the Z direction to position 48 which is further from the lens. If the negative lens of the telescope is moved in the opposite direction so that the separation between components increases then the beam exiting the telescope converges and the focal point after the f-theta lens moves closer to the lens. As an example of the magnitude of focal spot motion 49 that can be achieved consider the case where the lenses in the system have the following focal lengths:—

Negative telescope lens=−100 mm
Positive telescope lens=+125 mm
F-theta lens=+150 mm In this case the nominal separation between the telescope components is 25 mm and a motion of the negative lens by 3 mm in either direction to change the separation to 22 or 28 mm causes the f-theta lens focal spot to move in Z by about 4.5 mm in either direction.

Figure 5:
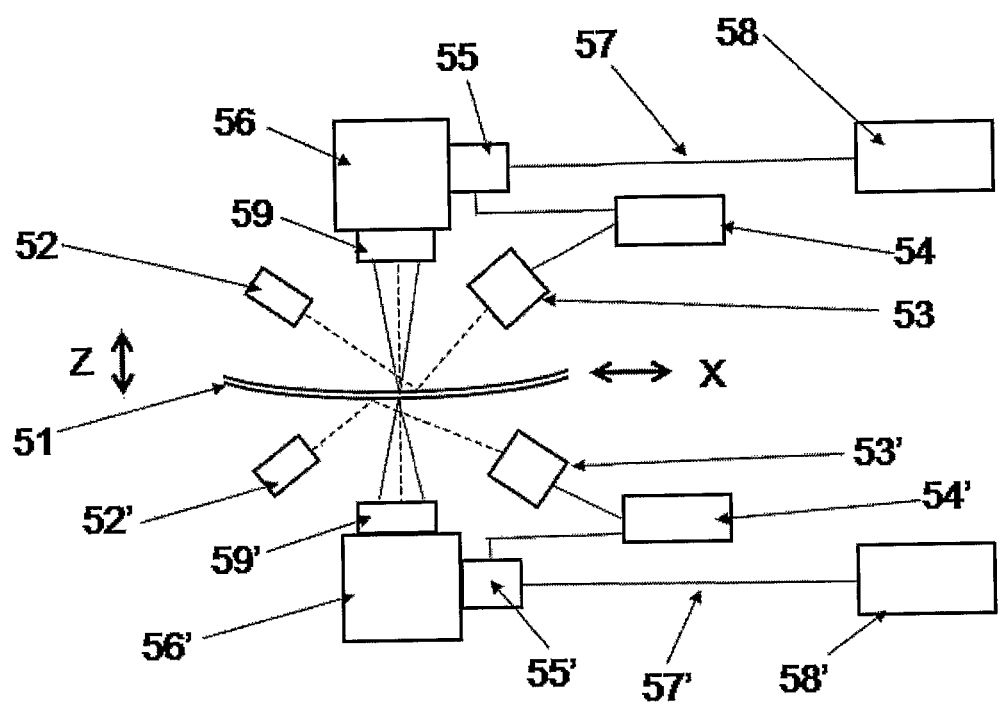
FIG. 5 shows one pair of scanner units in a situation where the substrate is not flat.

FIG. 5 shows how a pair of scanner and lens units respond as the panel is moved in the X and Y directions and the surface positions change in the Z direction due to variations in thickness and flatness. In the case shown the panel 51 is not flat due to sag in the Z direction and the distance of the upper surface from the upper scanner and lens unit has increased and the distance from the lower surface to the lower scanner and lens unit has decreased. In this case the laser spot on the upper surface of the panel produced by laser diode 52 moves laterally in the X direction to the right in the drawing and that produced by laser diode 52' on the lower surface of the panel moves laterally in the X direction to the left. In this case the laser spot movements on both sides of the panel are detected by the camera units 53, 53' which then generate signals that are processed by servo control units 54, 54' to cause the separation between the optical components in the telescopes 55, 55' to change. For the case shown the optical components in the telescope attached to the upper scanner unit 56 are caused to move closer together so that the focus of the beam 57 from the laser 58 after f-theta lens 59 moves further from the lens so that the focus remains at the correct position with respect to the panel surface. On the lower side of the panel the opposite happens and the optical components in the telescope attached to the lower scanner unit 56' are caused to move further apart so that the focus of the beam 57' from the laser 58' after f-theta lens 59' moves closer to the lens so that the focus remains at the correct position with respect to the panel surface.

Figure 6:
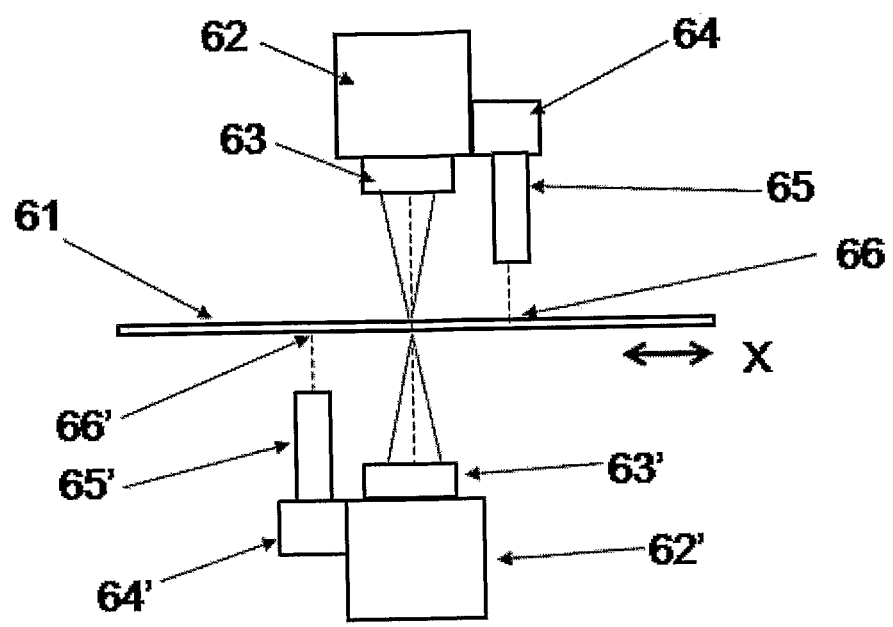
FIG. 6 shows a system that allows alignment to the devices.

FIG. 6 shows a modification to a pair of scanner and lens units to permit accurate alignment of the laser process patterns in the X and Y directions to existing patterns or alignment marks on the panel. Panel 61 is situated between a pair of opposing scanner 62, 62' and lens 63, 63' units. A camera unit 64, 64' is attached to each scanner and lens unit and each camera unit has associated optics 65, 65' in order to create an image of the panel surface at a point 66, 66' on the camera. As the optic axes of the camera and lens systems need to be normal to the panel surface the point of observation is offset from the centre of the scan field of each scanner and lens unit. In practical use this is not a problem so long as the offset distances in X and Y for each camera unit are known accurately.

Figure 7:
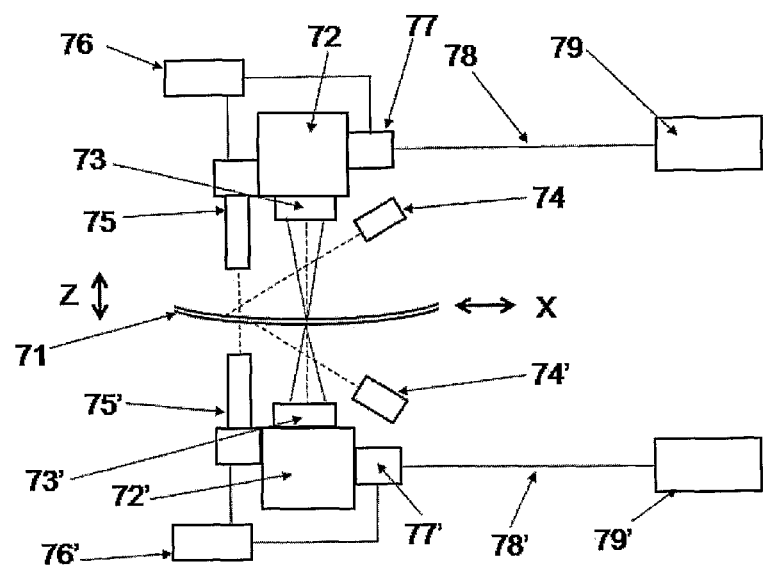
FIG. 7 shows a system that uses a common detector unit for both device lateral alignment and for correction for device flatness and thickness changes.

FIG. 7 shows the arrangement where the offset device alignment cameras are arranged to function for both alignment and distance sensing. Panel 71 is mounted between two scanner 72, 72' and lens units 73, 73'. Two laser diode units 74, 74' are arranged to direct their beams obliquely in order to create laser spots on the panel surface within the field of view of the camera units 75, 75' used for device alignment. In the case shown the panel is not flat due to sag in the Z direction and the distance of the upper surface from the upper scanner and lens unit has increased and the distance from the lower surface to the lower scanner and lens unit has decreased. In this case the laser spot on the upper surface of the panel produced by laser diode 74 moves laterally in the X direction to the left in the figure and that produced by laser diode 74' on the lower surface of the panel moves laterally in the X direction to the right. The spot movements on both sides of the panel are detected by the camera units which then generate signals that are processed and fed to servo-motor control units 76, 76' to cause the separation between the optical components in the telescopes 77, 77' to change. For the case shown the optical components in the telescope attached to the upper scanner unit 72 are caused to move closer together so that the focus of the beam 78 from the laser 79 after the upper f-theta lens moves further from the lens so that the focus remains at the correct position with respect to the panel surface. On the lower side of the panel the opposite happens and the optical components in the telescope attached to the lower scanner unit 77' are caused to move further apart so that the focus of the beam 78' from the laser 79' after the lower f-theta lens moves closer to the lens so that the focus remains at the correct position with respect to the panel surface.

Figure 8:
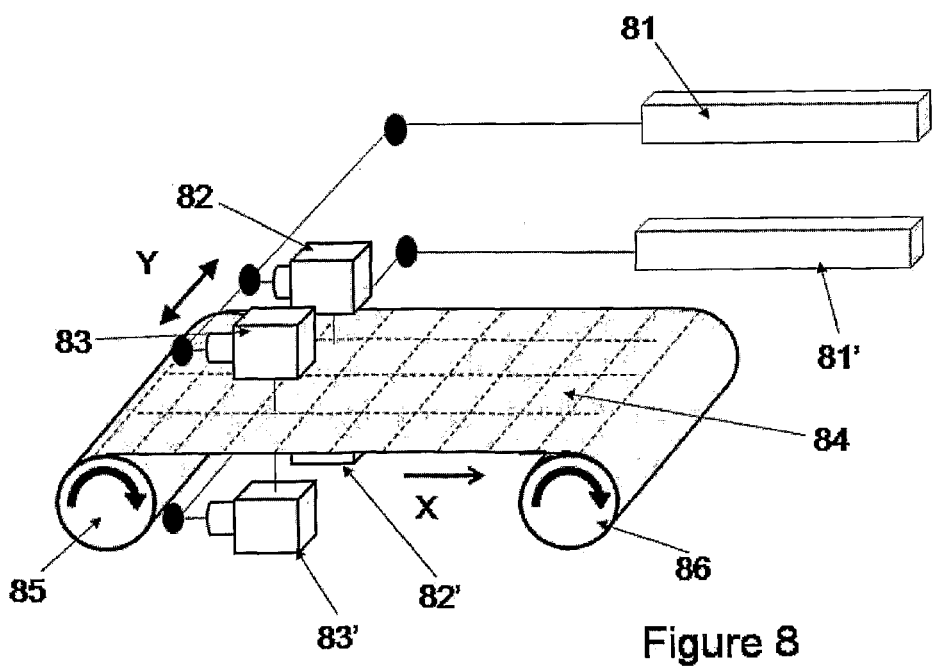
FIG. 8 shows a system suitable for processing flexible materials.

FIG. 8 shows a representation of a variation on the system that allows laser processing on both sides of a continuous web of thin flexible material. Lasers 81, 81' direct beams to 2 pairs of scanner and lens units 82, 82' and 83, 83'. The scanner and lens pairs are mounted on carriages on a gantry over the web and a stage below the web so that they can move in the Y direction across the web. The web of material to be processed 84 is indexed through the apparatus in the X direction by means of a web dispense drum 85 and a web take up drum 86. The web is sub-divided into a rectangular array of device areas with an even number of devices in the Y direction and the pitch of the scanner and lens units in the Y direction (P) is set to a value'given by:—

$$P = p \times N/n,$$

where p is the pitch of the devices on the web in the Y direction, N is the total number of devices across the web in the Y direction and n is the number of scanner and lens units in the Y direction. The system operates in step and scan mode with the scanner and lens units stepping in Y to complete all devices in a Y row followed by indexing of the web in X to allow new Y rows to be processed. In practice additional components such as alignment cameras and laser diodes are attached to each scanner and lens unit but these are not shown in the figure. The figure shows web material dispensed and removed from the tool directly by drums that are in close proximity to the process area whereas in practice it is likely that the drums will be separated some distance from the process area and intermediate rollers will be used to tension and transport the web.

Figure 9:
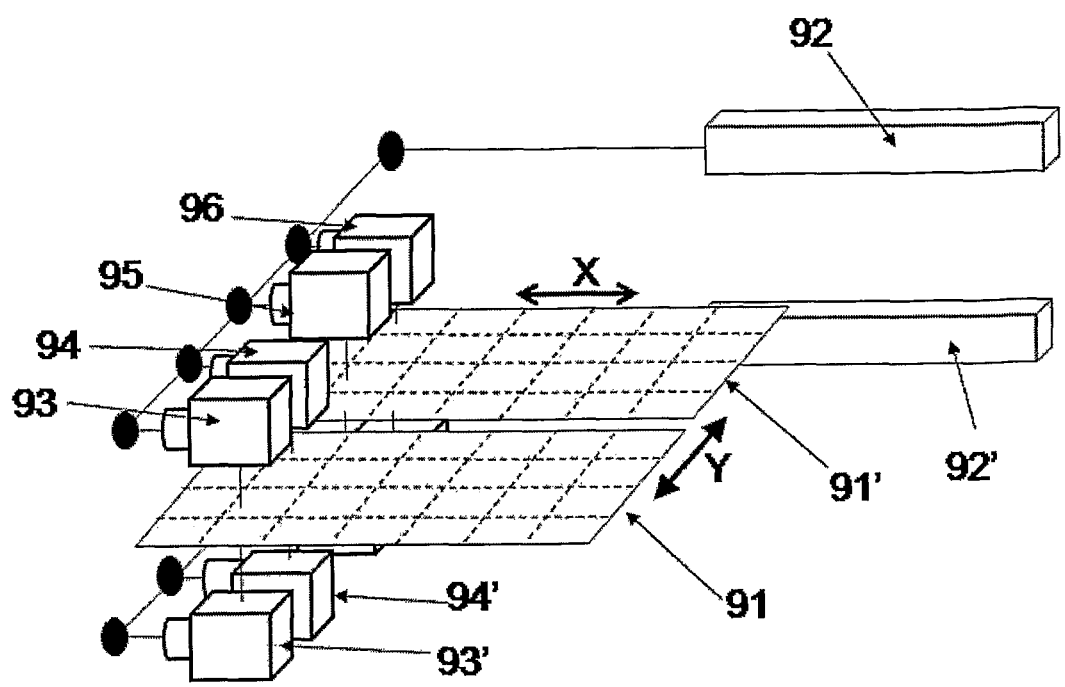
FIG. 9 shows a system configured to process two panels.

FIG. 9 shows an arrangement of the system that allows laser processing on both sides of two panels 91, 91' at the same time. Lasers 92, 92' direct beams to 4 pairs of scanner and lens units 93, 93', 94, 94', 95, 95' and 96, 96'. So that the lower laser beams can access the underside of both panels they are both mounted on a single open frame type support on stages that cause them to move in 2 orthogonal directions X and Y between the stationary scanner and lens units. Each panel is sub-divided into a rectangular array of device areas with an even number of devices on each panel in the Y direction and the pitch of the two scanner and lens units in the Y direction (P) processing each panel is set to a value given by:—

$$P = p \times N/n,$$

where p is the pitch of the devices on a panel in the Y direction, N is the total number of devices on a panel in the Y direction and n is the number of scanner and lens units in the Y direction processing each panel. The system operates in step and scan mode with the panels stepping in Y to complete all devices in a Y row on each panel followed by steps in X to allow new Y rows to be processed. The drawing shows two pairs of scanner and lens units in operation on each of the two panels but in practice a greater number of units can be used to increase the production rate of the system.

The invention claimed is:

1. A system for processing a multi-device panel, comprising a substrate having a front surface and a rear surface, a first array of device regions on the front surface and a second array of device regions on the rear surface, by vector direct-write laser ablation, the system comprising:
   a first processing station that includes a pair of oppposedly-mounted processing heads, each processing head including a laser beam delivery apparatus having a laser beam scanner and a lens unit, and a distance measurement means;
   mounting means for mounting the panel between the processing heads of the first processing station such that a relative position of the panel and the first processing station can be adjusted so that the processing heads are brought into alignment with selected front-surface and rear-surface device regions to be processed;
   wherein each processing head is operable to make an estimate of a distance between the lens unit and the surface of the device region to be processed using the distance measurement means,
   wherein each processing head is operable to control a focus by moving the lens unit dependent on said estimate of the distance; and
   wherein each processing head is operable to vector direct-write the device region.

2. A system as in claim 1, wherein the system is arranged to relatively move the first processing station and the panel in a stepwise manner, whereby successive front-surface and rear-surface device regions may be processed by the laser beam scanner of the respective processing head.

3. A system as in claim 1, further comprising a second processing station operating in parallel with the first processing station.

4. A system as in claim 1, wherein the mounting means comprises a pair of linear stage units that allow relative motion in two axes between the panel and the first processing station.

5. A system as in claim 1, wherein the system is operable to lock the position of the panel once the first processing station is positioned ready for laser processing.

6. A system as in claim 1, wherein said distance measurement means comprises a directed light source for directing a beam at an angle to the nominal normal of the panel surface towards the panel surface and a camera unit for imaging the area of the panel surface upon which the beam is incident.

7. A system as in claim 1, wherein each processing head further includes a camera unit for imaging the surface of the panel to assist in the alignment of the lens unit with said device region.

8. A system as in claim 1, wherein the distance measurement means comprises a directed light source for directing a beam at the nominal normal to the panel surface towards the panel surface and a camera unit imaging the area of the panel surface upon which the beam in incident.

9. A system as in claim 8, wherein the camera unit is also used to assist in the alignment of the lens unit with said device regions.

10. A method for processing a multi-device panel, comprising a substrate having a front surface and a rear surface, a first array of device regions on the front surface and a second array of device regions on the rear surface, by vector direct-write laser ablation, the method comprising:
    providing a first processing station that includes a pair of opposedly-mounted processing heads, each processing head including a laser beam delivery apparatus having a laser beam scanner and a lens unit, and a distance measurement means;
    arranging a relative position of the panel and the processing heads of the first processing station such that the processing heads are brought into alignment with selected front-surface and rear-surface device regions to be processed;
    for each processing head,
    making an estimate of a distance between the lens unit and the surface of the device region to be processed using the distance measurement means;
    focusing the lens unit dependent on said estimate; and
    vector direct writing the device region.

11. A method as in claim 10, wherein the method is performed with three or more processing stations.

12. A method as in claim 10, wherein the method is performed repeatedly on successive front-surface and rear-surface device regions until the processing of the multi-device panel is completed.

* * * * *